US008130529B2

(12) United States Patent
Tanaka

(10) Patent No.: US 8,130,529 B2
(45) Date of Patent: Mar. 6, 2012

(54) SEMICONDUCTOR DEVICE

(75) Inventor: Takuji Tanaka, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 698 days.

(21) Appl. No.: 12/273,846

(22) Filed: Nov. 19, 2008

(65) Prior Publication Data
US 2009/0134473 A1 May 28, 2009

(30) Foreign Application Priority Data

Nov. 27, 2007 (JP) ................................. 2007-305420

(51) Int. Cl.
*G11C 5/06* (2006.01)
*G11C 11/00* (2006.01)
*H01L 27/088* (2006.01)

(52) U.S. Cl. .......... 365/72; 365/154; 365/156; 257/393; 257/401

(58) Field of Classification Search .................... 365/72, 365/154, 156; 257/393, 401
See application file for complete search history.

(56) References Cited

U.S. PATENT DOCUMENTS

| | | | | | |
|---|---|---|---|---|---|
| 5,239,201 | A | * | 8/1993 | Asano | 257/401 |
| 5,359,226 | A | * | 10/1994 | DeJong | 257/401 |
| 5,391,894 | A | * | 2/1995 | Itabashi et al. | 257/401 |
| 5,483,104 | A | * | 1/1996 | Godinho et al. | 257/401 |
| 5,526,303 | A | * | 6/1996 | Okajima | 365/154 |
| 6,072,714 | A | * | 6/2000 | Deguchi | 365/154 |
| 6,507,124 | B2 | * | 1/2003 | Kumagai et al. | 365/154 |
| 6,653,695 | B2 | * | 11/2003 | Oyamatsu | 257/393 |
| 6,653,696 | B2 | * | 11/2003 | Karasawa et al. | 257/393 |
| 6,815,777 | B2 | * | 11/2004 | Karasawa et al. | 257/393 |
| 7,038,926 | B2 | * | 5/2006 | Jeong et al. | 257/401 |
| 7,064,453 | B2 | * | 6/2006 | Sato | 257/401 |
| 7,078,774 | B2 | * | 7/2006 | Kondo et al. | 257/393 |
| 7,852,655 | B2 | * | 12/2010 | Tanaka | 365/72 |
| 2004/0212018 | A1 | | 10/2004 | Shino | |

FOREIGN PATENT DOCUMENTS

| | | |
|---|---|---|
| JP | 6-350053 A | 12/1994 |
| JP | 8-37241 A | 2/1996 |
| JP | 9-321152 A | 12/1997 |
| JP | 10-335487 A | 12/1998 |

OTHER PUBLICATIONS

Korean Office Action dated Oct. 25, 2010, issued in corresponding Korean Patent Application No. 10-2008-0116864.

* cited by examiner

*Primary Examiner* — Trong Phan
(74) *Attorney, Agent, or Firm* — Westerman, Hattori, Daniels & Adrian, LLP

(57) ABSTRACT

A semiconductor device has a pair of gate electrodes extending adjacent to and non-parallel to each other, a source and/or drain region located between the pair of gate electrodes for forming a pair of transistors with the gate electrodes, and a contact electrode disposed between the pair of gate electrodes in contact with the source and/or drain region in a contact area so that the center of the contact area is shifted from the center of the source and/or drain region in a direction along which the distance between the pair of gate electrodes becomes greater.

14 Claims, 16 Drawing Sheets

SEMICONDUCTOR DEVICE

CROSS-REFERENCE TO RELATED APPLICATION

This application is based upon and claims the benefit of priority of the prior Japanese Patent Application No. 2007-305420 filed on Nov. 27, 2007, the entire contents of which are incorporated herein by reference.

BACKGROUND

1. Field

An aspect of the embodiments discussed herein is directed to a semiconductor device including a plurality of transistors.

2. Description of the Related Art

Not only high-performance design but also miniaturization and high degree of integration are promoted on semiconductor devices.

A static random access memory (SRAM), as one type of volatile memories, is free from a refresh operation, and operates at a high speed. The SRAM finds applications in a variety of apparatuses. The SRAM is typically constructed of parallel unit cells, in which gate electrodes of transistors are linearly disposed in parallel to each other on a plane and active regions are linearly disposed in parallel to each other and intersect the gate electrodes.

Arrangements of the SRAM unit cells are discussed in Japanese Laid-open Patent Publication Nos. 6-350053, 8-37241, 9-321152, and 10-335487. In the disclosed arrangements, the gate electrodes and the active regions are slant to mutually intersecting word lines and bit lines at an upper layer in plan view.

The size reduction and high degree of integration are introduced in the SRAM unit cells by reducing the gate electrodes and active regions in size, narrowing the spacing between the adjacent elements, and extending the elements in an inclination angle.

Demand for even further miniaturization and higher degree of integration is mounting as the SRAMs find applications in a wider range of fields and have a larger memory size.

In each transistor forming the SRAM, a contact electrode is disposed in each of active regions on both sides of a gate electrode in order to establish electrical connection with an upper wiring layer. A distance between the gate electrode and the contact electrode is already narrow in the current design of the SRAM, and a position margin permitted therebetween is very small. It is desirable for conventional techniques to promote further miniaturization and higher degree of integration with position margin assured.

The same phenomenon may occur not only on the SRAM but also on other semiconductor devices composed of a plurality of transistors.

SUMMARY

According to an aspect of an embodiment, a semiconductor device has a pair of gate electrodes extending adjacent to and non-parallel to each other, a source and/or drain region located between the pair of gate electrodes for forming a pair of transistors with the gate electrodes, and a contact electrode disposed between the pair of gate electrodes in contact with the source and/or drain region in a contact area so that the center of the contact area is shifted from the center of the source and/or drain region in a direction along which the distance between the pair of gate electrodes becomes greater.

These together with other aspects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

SRAMs of embodiments are described below with reference to the drawings.

Figure 1:
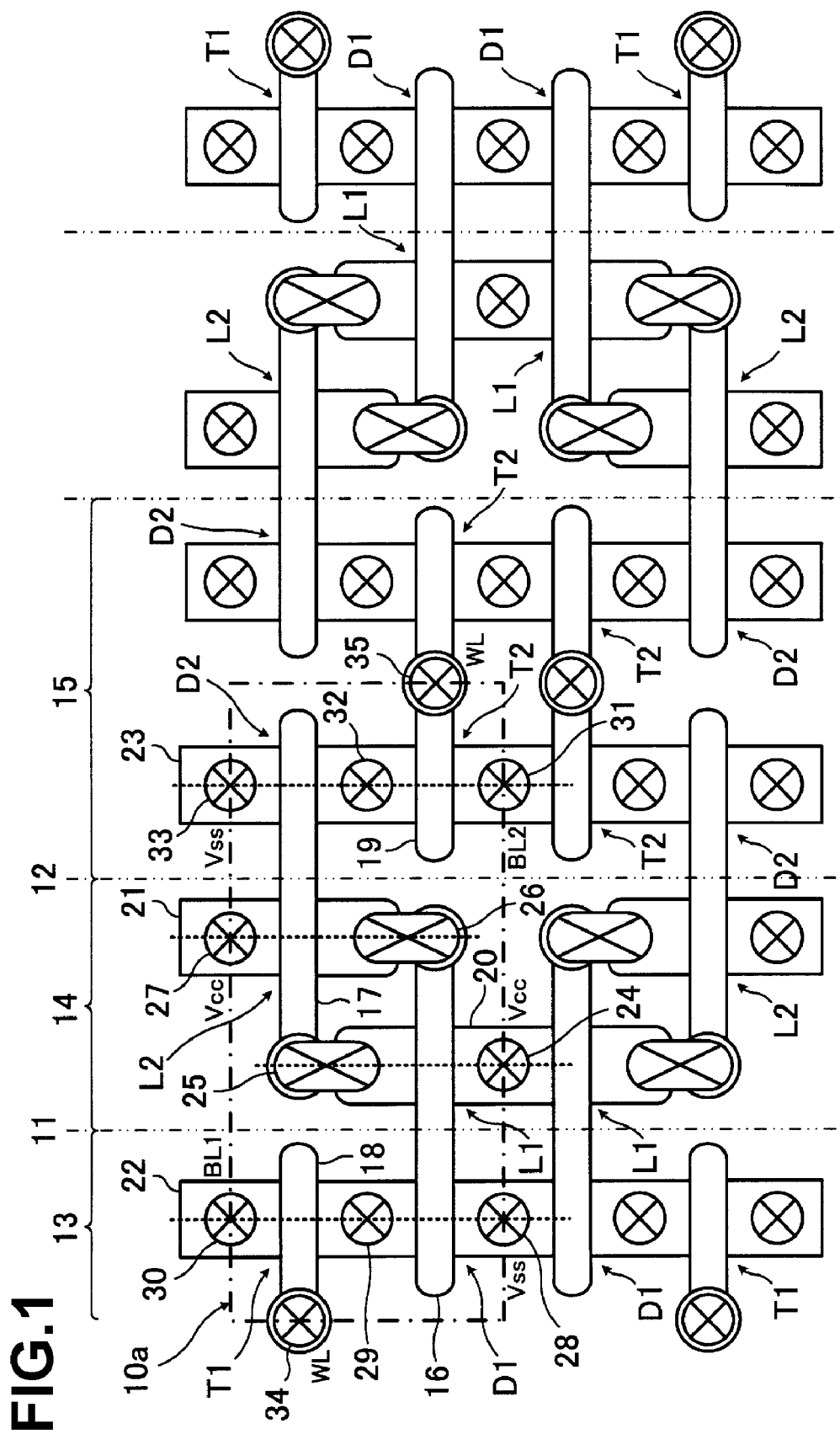
FIG. 1 is a plan view illustrating a major portion of a parallel-arrayed SRAM.

A basic structure of a parallel-arrayed SRAM is described. FIG. 1 is a plan view of the parallel-arrayed SRAM.

FIG. 1 illustrates only four unit cells forming the parallel-arrayed SRAM. A unit cell 10a enclosed in a dot-dash line box in FIG. 1 is described. The unit cell 10a includes six transistors, namely, load transistors L1 and L2 disposed in the center portion thereof, driver transistors D1 and D2 and transfer transistors T1 and T2 disposed on both sides of the center portion.

The unit cell 10a includes well region boundaries 11 and 12 where semiconductor type regions doped with different impurities meet as represented by two-dot-and-dash chain lines. The driver transistors D1 and D2 and the transfer transistors T1 and T2, included in well regions 13 and 15, are n-type transistors. The load transistors L1 and L2 included in a well region 14 are p-type transistors.

In the geometry of the six transistors in the parallel-arrayed SRAM, a gate electrode 16 of the load transistor L1 and the driver transistor D1, a gate electrode 17 of the load transistor L2 and the driver transistor D2, gate electrodes 18 and 19 of the transfer transistors T1 and T2 are linear and parallel to each other in plan view.

In the parallel-arrayed SRAM, source and/or drain regions 20, 21, 22 and 23 linearly extend in plan view in substantially perpendicular to the gate electrodes 16 through 19. The source and/or drain region 20 is disposed to be in substantially perpendicular to the gate electrode 16 within the unit cell 10a. The source and/or drain region 21 is disposed to be in substantially perpendicular to the gate electrode 17 within the unit cell 10a. The source and/or drain region 22 is disposed to be in substantially perpendicular to the gate electrodes 16 and 18 within the unit cell 10a. The source and/or drain region 23 is disposed to be in substantially perpendicular to the gate electrodes 17 and 19.

Contact electrodes 24-35 are disposed to be connected to the gate electrodes 16-19 and the source and/or drain regions 20-23. The contact electrodes 24-33 are centered on center lines C of the respective source and/or drain regions 20-23.

Figure 2:
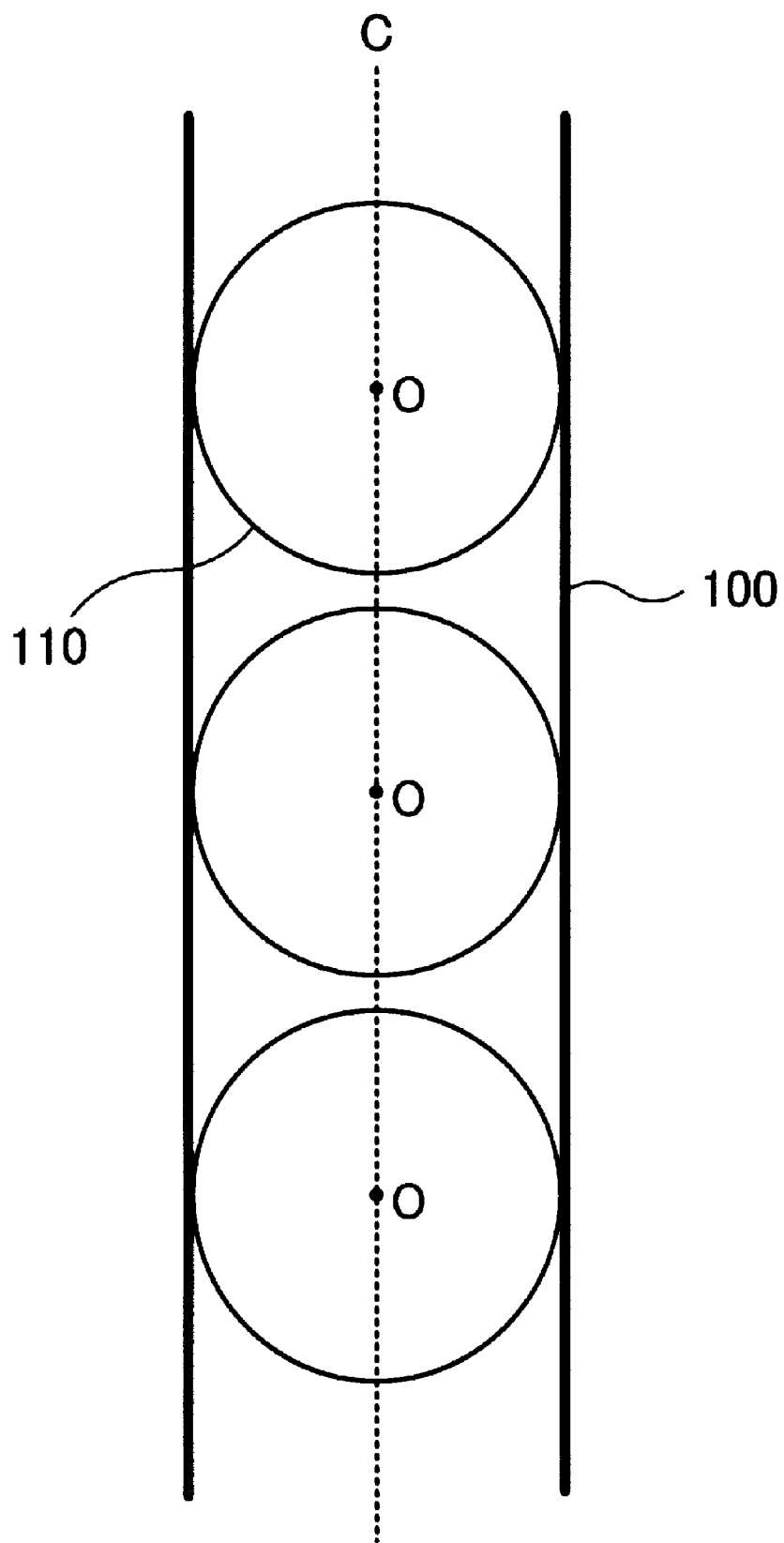
FIG. 2 illustrates a center line of a linearly extending active region.

FIG. 2 illustrates the center line C of a source and/or drain region 100 having a linear shape in plan view.

As illustrated in FIG. 2, the center line C of the linearly extending source and/or drain region 100 is an envelope line (as denoted by a dotted line) that is drawn by connecting the centers of circles 110 inscribing the source and/or drain region 100 when the circle 110 is slid continuously along the source and/or drain region 100. (The circle 110 touches at two points, one point at a right edge and the other point at a left edge of the source and/or drain region 100). The center line C of each of the source and/or drain regions 20-23 within the unit cell 10a is similarly defined.

The contact electrodes 24 and 27 of the load transistors L1 and L2 are connected to a power source line Vcc at an upper layer. More specifically, source regions of the load transistors L1 and L2 are together connected to the power source line Vcc.

The contact electrodes 28 and 33 of the driver transistors D1 and D2 are connected to a ground line Vss at the upper layer. More specifically, source regions of the driver transistors D1 and D2 are connected together to the ground line Vss.

The contact electrode 30 of the transfer transistor T1 is connected to a first bit line BL1 at the upper layer, and the contact electrode 31 of the transfer transistor T2 is connected to a second bit line BL2 at the upper layer. More specifically, a source region of the transfer transistor T1 is connected to the first bit line BL1 and a source region of the transfer transistor T2 is connected to the second bit line BL2.

The contact electrodes 34 and 35 respectively connected to the gate electrodes 18 and 19 of the transfer transistors T1 and T2 are connected to a common word line WL at the upper layer.

The shared contact technique is applied to the contact electrodes 25 and 26 respectively connected to the gate electrodes 17 and 16. The contact electrode 25 is connected to the contact electrode 29 at the upper layer, and the contact electrode 26 is connected to the contact electrode 32 at the upper layer. More specifically, the gate electrode 17 of the load transistor L2 and the driver transistor D2 is connected to a drain region of each of the load transistor L1, the driver transistor D1, and the transfer transistor T1. The gate electrode 16 of the load transistor L1 and the driver transistor D1 is connected to each of drain regions of the load transistor L2, the driver transistor D2, and the transfer transistor T2.

A large number of cell units, each unit having substantially the same structure as the unit cell 10a, are disposed symmetrically side by side horizontally and one on top of another vertically. A parallel-arrayed SRAM having a predetermined memory size is thus constructed.

Each of the load transistors L1 and L2, the driver transistors D1 and D2, and the transfer transistors T1 and T2 may include a metal insulator semiconductor (MIS) field effect transistor (FET). The transistors may be fabricated in a single substrate.

If each transistor is inclined at a predetermined direction in a plan view without changing electrical connections between elements in the layout of the unit cell 10a of FIG. 1, each cell may be reduced in size.

Figure 3:
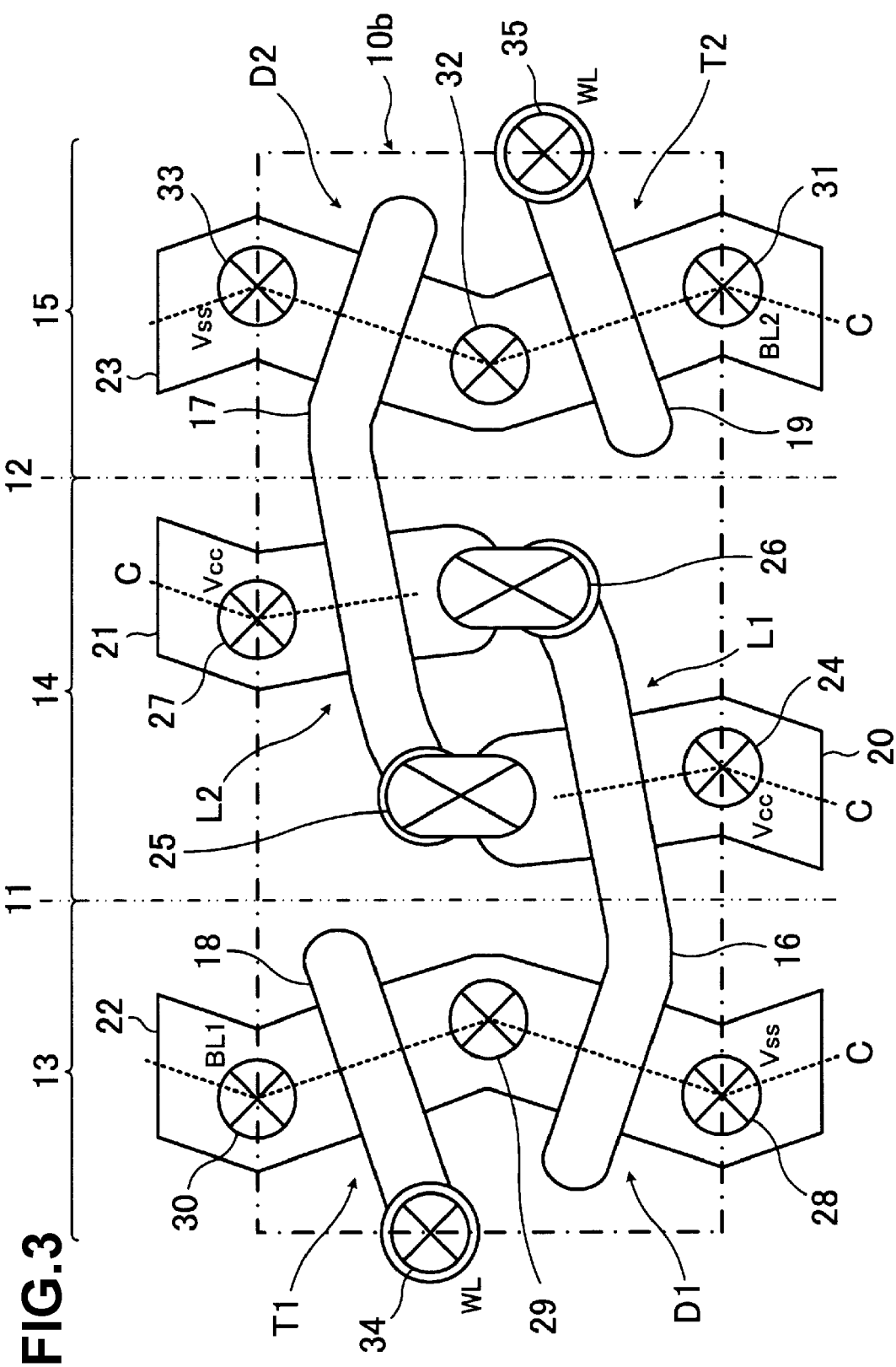
FIG. 3 is a plan view of a unit cell in which transistors are disposed at an inclination angle in accordance with one embodiment.

FIG. 3 is a plan view of the unit cell with the transistors inclined in plan view.

With reference to FIG. 3, the unit cell 10a enclosed by a dot-and-dash chain line box as illustrated in FIG. 1 is modified in layout to a unit cell 10b with each transistor inclined at a predetermined direction.

The unit cell 10a enclosed in the dot-and-dash chain line box in FIG. 1 is modified into the unit cell 10b of FIG. 3. More specifically, the transfer transistors T1 and T2 are inclined counterclockwise about the contact electrodes 29 and 32 respectively by an angle, the driver transistors D1 and D2 are inclined clockwise about the contact electrodes 29 and 32 respectively by an angle, and the load transistors L1 and L2 are inclined counterclockwise by an angle.

Each transistor is inclined at a predetermined direction without changing the distance between the gate electrode 16 and each of the contact electrodes 24, 25, 28 and 29, the distance between the gate electrode 17 and each of the contact electrodes 26, 27, 32 and 33, the distance between the gate electrode 18 and each of the contact electrodes 29 and 30, and the distance between the gate electrode 19 and each of the contact electrodes 31 and 32. The contact electrodes 24, 28, and 31 and the contact electrodes 27, 30, and 33 are disposed in cell boundaries. The gate electrodes 16 and 17 are shaped in a configuration matching the inclined driver transistors D1 and D2 and the inclined load transistors L1 and L2.

The size of the unit cell 10b in a vertical direction of FIG. 3 is thus reduced by inclining at an inclination angle the load transistors L1 and L2, the driver transistors D1 and D2, and the transfer transistors T1 and T2.

The angle of inclination as a result of inclining each transistor in the unit cell 10b of FIG. 3 is preferably less than 90° with respect to the unit cell 10a of FIG. 1, and more preferably equal to or smaller than 45°. If the angle of inclination is 45° or larger, elements are likely to interfere with each other in the geometry thereof, and a wiring arrangement formed at an upper layer may need to be modified. The angle of inclination equal to or smaller than 45° frees the unit cell from the problem of interference of the elements and modification of layout. The transistors, if inclined in plan view, does not lead to any other difficult design problem. No difficulty is presented on manufacturing of the elements on the basis of the design.

In the designing of the SRAM unit cell 10a and the SRAM unit cell 10b, the elements need to be disposed so that a predetermined distance between the elements or a distance of minimum design rule or minimum manufacturing rule is maintained. More specifically, a certain distance needs to be maintained between the gate electrode 16 and each of the contact electrodes 24, 25, 28 and 29, between the gate electrode 17 and each of the contact electrodes 26, 27, 32 and 33, between the gate electrode 18 and each of the contact electrodes 29 and 30, and between the gate electrode 19 and each of the contact electrodes 31 and 32. A short circuit may take place between one of the gate electrodes 16-19 and one of the contact electrodes 24-33 formed in the source and/or drain regions 20-23 respectively in the manufacturing of the semiconductor device on the basis of the design if a certain distance is not maintained and if one of the gate electrodes 16-19 and contact holes deviates in the formation position thereof.

The contact electrodes 24 and 27-33 connected to the source and/or drain regions 20-23 are thus shifted in a predetermined direction on the unit cell 10b that is miniaturized in size by inclining each transistor by an inclination angle. As a result, the size reduction is further promoted while a constant distance is maintained between each of the gate electrodes 16-19 and each of the contact electrodes 24 and 27-33.

Figure 4:
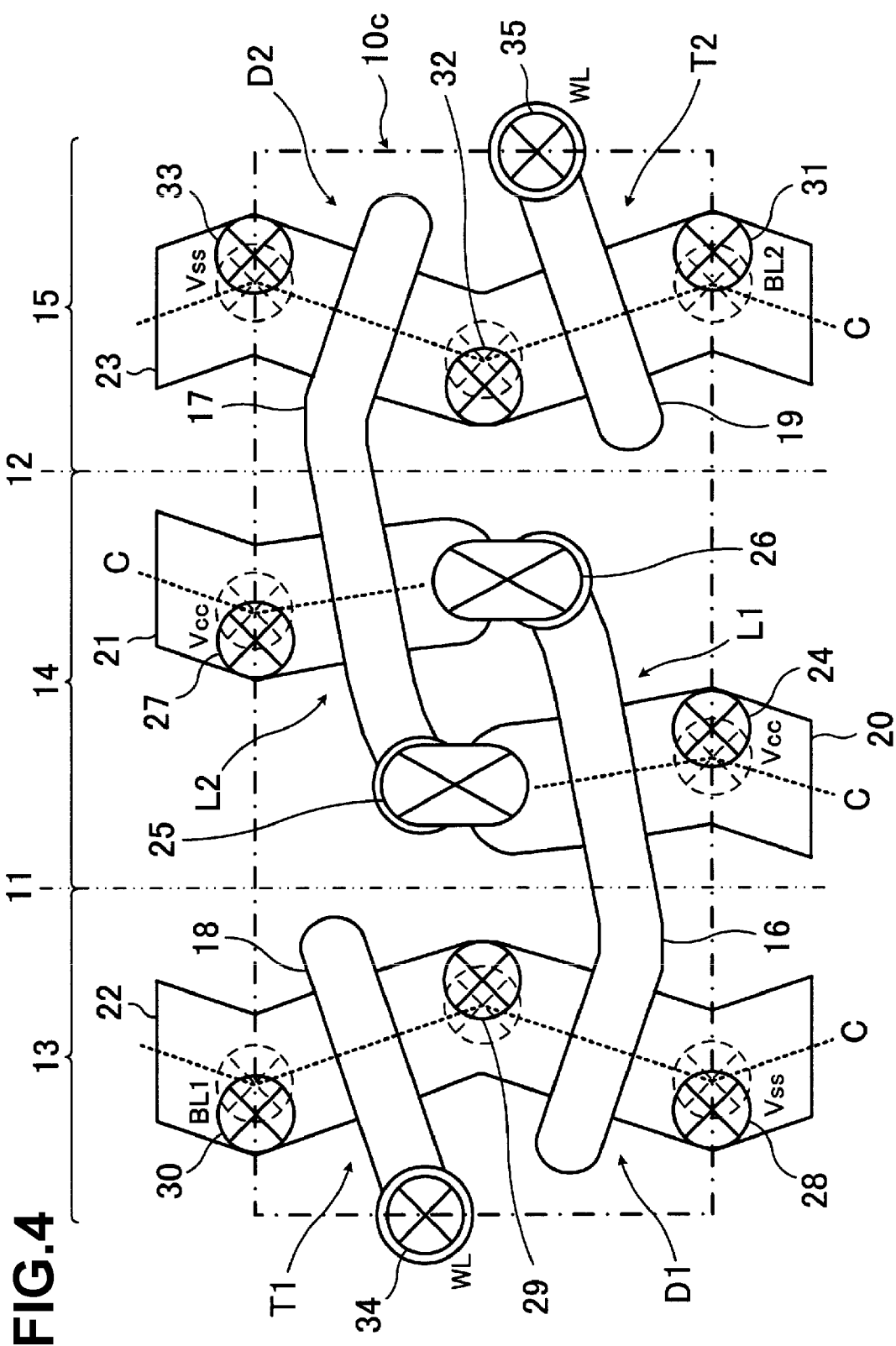
FIG. 4 is a plan view of a unit cell in accordance with a first embodiment.
Figure 5:
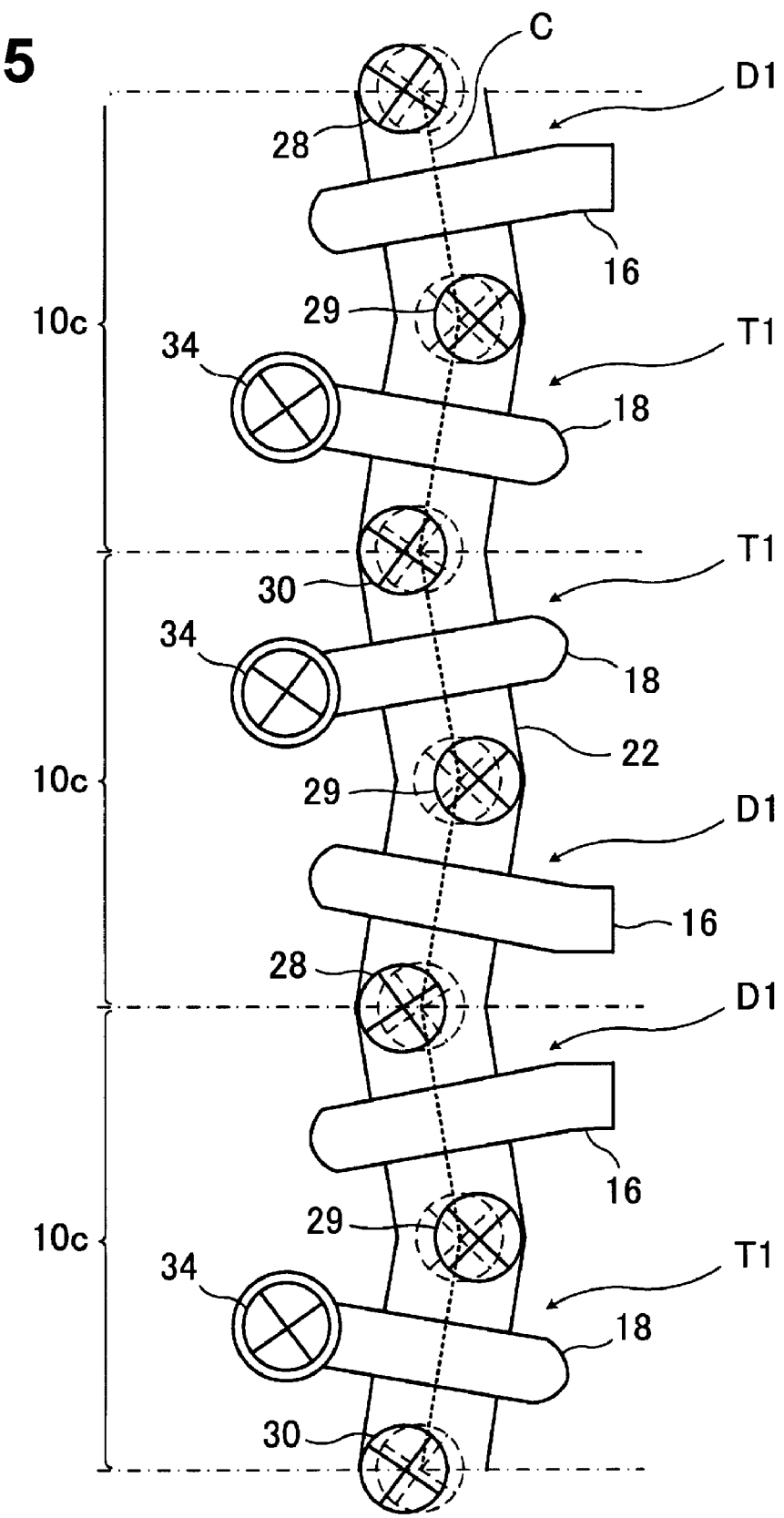
FIG. 5 is a plan view illustrating a major portion of an arrangement of contact electrodes in accordance with the first embodiment.

FIG. 4 is a plan view illustrating the unit cell in accordance with the first embodiment, and FIG. 5 is a plan view illustrating a major portion of a contact electrode arrangement of the first embodiment.

Since each transistor is inclined at an angle on the unit cell 10b of FIG. 3, the source and/or drain regions 20-23 are bent in plan view. The contact electrode 24 is centered on the center line C of the bent source and/or drain region 20 (as represented by chain lines in FIGS. 4 and 5). The contact electrode 27 is centered on the center line C of the bent source and/or drain region 21 (as represented by chain lines in FIGS. 4 and 5). The contact electrodes 28-30 are centered on the center line C of the bent source and/or drain region 22 (as represented by chain lines in FIGS. 4 and 5). The contact electrodes 31-33 are centered on the center line C of the bent source and/or drain region 23 (as represented by chain lines in FIGS. 4 and 5).

Figure 6:
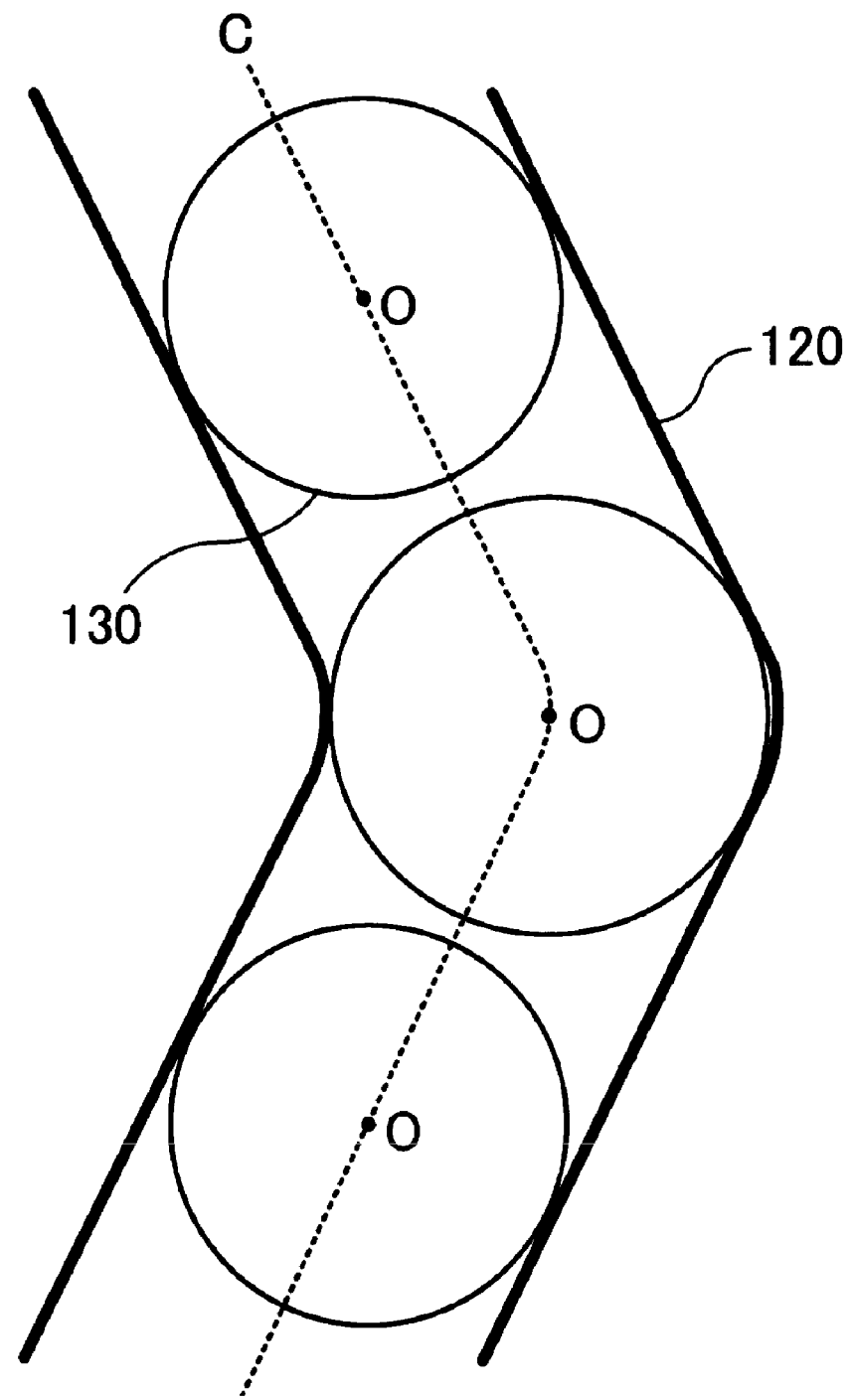
FIG. 6 illustrates a bent center line of an active region in accordance with one embodiment.

FIG. 6 illustrates the center line C of each bent source and/or drain region.

With reference to FIG. 6, the center line C of a linearly extending source and/or drain region 120 is an envelope line (as denoted by a broken line) that is drawn by connecting the centers of circles 130 inscribing the source and/or drain region 120 when the circle 130 is slid continuously along the source and/or drain region 120. (The circle 130 touches at two points, one point at a convex right edge and the other point at a concave left edge of the source and/or drain region 120). The center line C of each of the source and/or drain regions 20-23 within the unit cell 10b is similarly defined.

The contact electrodes 24 and 27-33 are moved from the center lines C of the source and/or drain regions 20-23 respectively in a unit cell 10c as shown in FIGS. 4 and 5.

As illustrated in FIGS. 4 and 5, the contact electrode 29 is disposed between the gate electrode 16 and 18 non-parallel to each other of the driver transistor D1 and the transfer transistor T1. In this arrangement, the contact electrode 29 is shifted with the center of the contact electrode 29 moved from the center line C of the source and/or drain region 22 in a direction along which the distance between the gate electrodes 16 and 18 becomes greater. By placing the contact electrode 29 in such a position, a great distance to each of the gate electrodes 16 and 18 is maintained. In other words, the contact electrode 29 is disposed to be closer to each of the gate electrodes 16 and 18 in a generally vertical direction in FIG. 4 by a margin caused in this arrangement.

The other contact electrodes 28 and 30 connected to the source and/or drain region 22 are also disposed in a similar arrangement. As illustrated in FIGS. 4 and 5, the contact electrode 28 is shifted with the center thereof moved from the center line C of the source and/or drain region 22 in a direction along which the distance between the gate electrode 16 and a gate electrode 16, non-parallel to the first gate electrode 16, in another unit cell 10c symmetrical and adjacent to the unit cell 10c of FIG. 4 becomes greater. The contact electrode 30 is shifted with the center thereof moved from the center line C of the source and/or drain region 22 in a direction along which the distance between the gate electrode 18 and a gate electrode 18, non-parallel to the first gate electrode 18, in another unit cell 10c symmetrical and adjacent to the unit cell 10c of FIG. 4 becomes greater.

The same is true of the source and/or drain region 23 forming the driver transistor D2 and the transfer transistor T2. More specifically, the contact electrode 32 is shifted with the center thereof moved from the center line C of the source and/or drain region 23 in a direction along which the distance between the gate electrodes 17 and 19 becomes greater as shown in FIG. 4. The contact electrode 31 is shifted with the center thereof moved from the center line C of the source and/or drain region 23 in a direction along which the distance between the gate electrode 19 on the unit cell 10c of FIG. 4 and a gate electrode 19 on a unit cell 10c (not shown in FIG. 4) symmetrical to and adjacent to the unit cell 10c of FIG. 4 becomes greater. The contact electrode 33 is shifted with the center thereof moved from the center line C of the source and/or drain region 23 in a direction along which the distance between the gate electrode 17 on the unit cell 10c of FIG. 4 and a gate electrode 17 on a unit cell 10c (not shown in FIG. 4) symmetrical to and adjacent to the unit cell 10c of FIG. 4 becomes greater.

The same is true of the source and/or drain regions 20 and 21, respectively forming the load transistors L1 and L2. More specifically, the contact electrode 24 is shifted with the center thereof moved from the center line C of the source and/or drain region 20 in a direction along which the distance between the gate electrode 16 on the unit cell 10c of FIG. 4 and a gate electrode 16 on a unit cell 10c (not shown in FIG. 4) symmetrical to and adjacent to the unit cell 10c of FIG. 4 becomes greater. The contact electrode 27 is shifted with the center thereof moved from the center line C of the source and/or drain region 21 in a direction along which the distance between the gate electrode 17 on the unit cell 10c of FIG. 4 and a gate electrode 17 on a unit cell 10c (not shown in FIG. 4) symmetrical to and adjacent to the unit cell 10c of FIG. 4 becomes greater.

Arranging the contact electrodes 24 and 27-33 connected to the source and/or drain regions 20-23 in this way increases the distance between the gate electrode 16 and each of the contact electrodes 24, 28, and 29, the distance between the gate electrode 17 and each of the contact electrodes 27, 32, and 33, the distance between the gate electrode 18 and each of the contact electrodes 29 and 30, and the distance between the gate electrode 19 and each of the contact electrodes 31 and 32. The elements are disposed closer to each other in a generally vertical direction of FIG. 4 with a predetermined distance therebetween still maintained. The size of the unit cell 10c in a generally vertical direction of FIG. 4 is thus reduced, and the area size occupied by the unit cell 10c is also reduced. The SRAM is thus miniaturized with the unit cells 10c integrated at a high degree of integration. A large memory capacity SRAM thus results.

An increase in the distance between the elements may be used for a position error margin during formation of the elements.

Each of the contact electrodes 24 and 27-33 is disposed between a corresponding pair of gate electrodes 16-29. In this geometry, each contact electrode is equidistant from the corresponding pair of surrounding gate electrodes.

A bottom portion of each of the contact electrodes 24 and 27-33 is partly placed into contact with a predetermined portion of the respective source and/or drain regions 20-23. From the standpoint of contact resistance, the entire bottom portion of each of the contact electrodes 24 and 27-33 preferably falls within the respective source and/or drain region. More specifically, the entire bottom portion of the contact electrode 24 is preferably present within the source and/or drain region 20. The entire bottom portion of the contact electrode 27 is preferably present within the source and/or drain region 21. The entire bottom portions of the contact electrodes 28-30 are preferably present within the source and/or drain region 22, and the entire bottom portions of the contact electrodes 31-33 are present within the source and/or drain region 23.

No substantial design change is needed in the wiring structure at the upper layer when the unit cell 10c of FIGS. 4 and 5 is manufactured.

The source and/or drain regions 22 and 23 may have different widths thereacross between the transfer transistors T1 and T2 and the driver transistors D1 and D2. In such a case, the contact electrodes 28-30 and 31-33 are also shifted in position in the same manner as described above.

Figure 7:
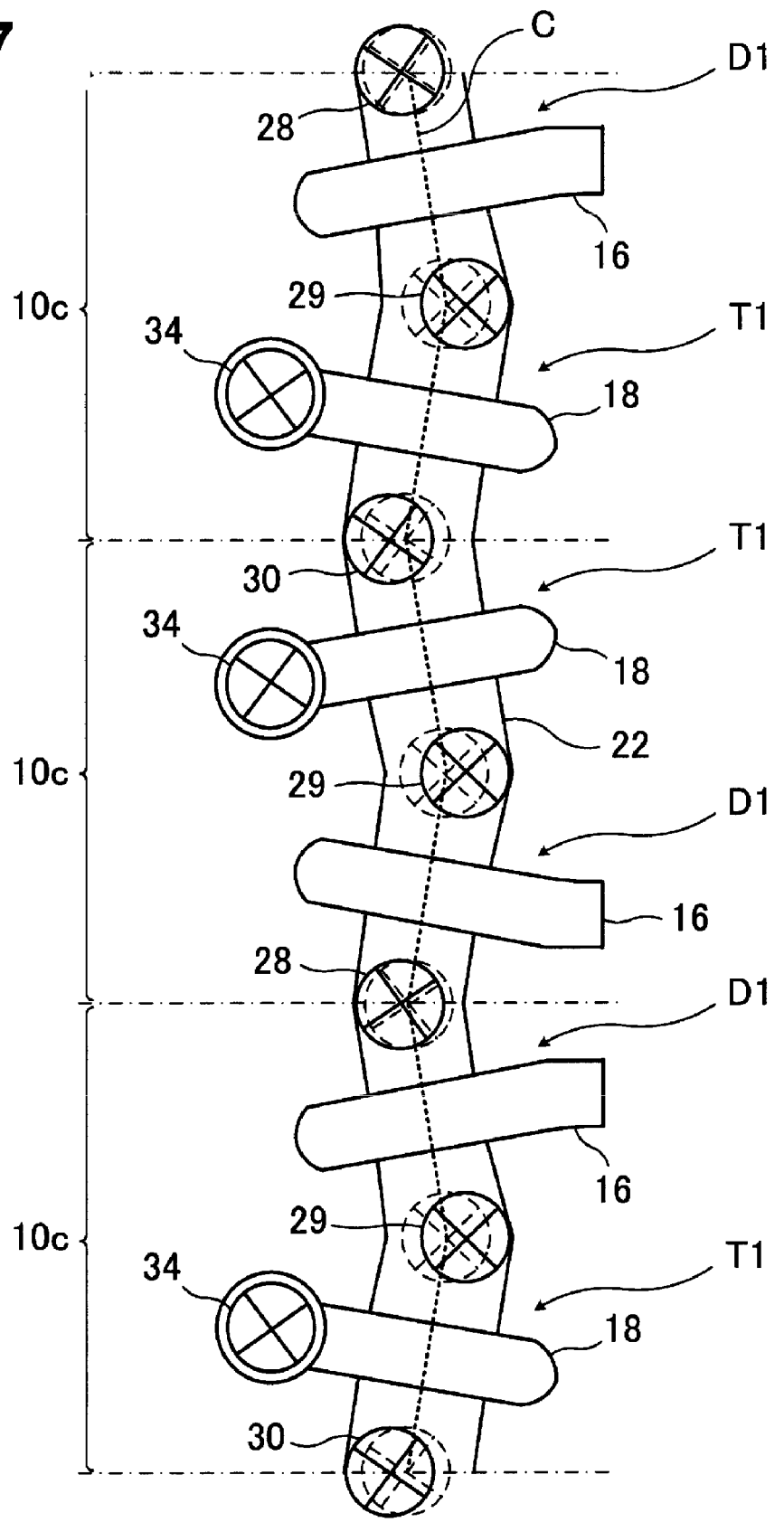
FIG. 7 is a plan view illustrating a major portion of another arrangement example of contract electrodes in accordance with one embodiment.

FIG. 7 is a plan view of a major portion of another example of a contact electrode arrangement.

As illustrated in FIG. 7, the width of the source and/or drain region 22 of the unit cell 10c (longitudinal length of each of the gate electrodes 16 and 18) is relatively large in the transfer transistor T1 and relatively small in the driver transistor D1. In this case, as well, the contact electrodes 28-30 are shifted with the centers thereof moved from the center line C of the source and/or drain region 22 in a direction along which the distance between non-parallel gate electrodes 16 and 18 becomes greater. The center line C of the source and/or drain region 22 is an envelope line that connects the centers of the circles inscribing the source and/or drain region 22 as described with reference to FIG. 6.

The distance between the gate electrode 16 and each of the contact electrodes 28 and 29 and the distance between the gate electrode 18 and each of the contact electrodes 29 and 30 are set to be larger than when the contact electrodes 28-30 are centered on the center line C of the source and/or drain region 22 (represented by the chain line in FIG. 7). The size of the unit cell 10c in a substantially vertical direction of FIG. 7 is thus reduced accordingly, and the unit cell 10c is thus reduced in size.

The same is true of the source and/or drain region 23 of the transfer transistor T2 and the driver transistor D2.

Figure 8:
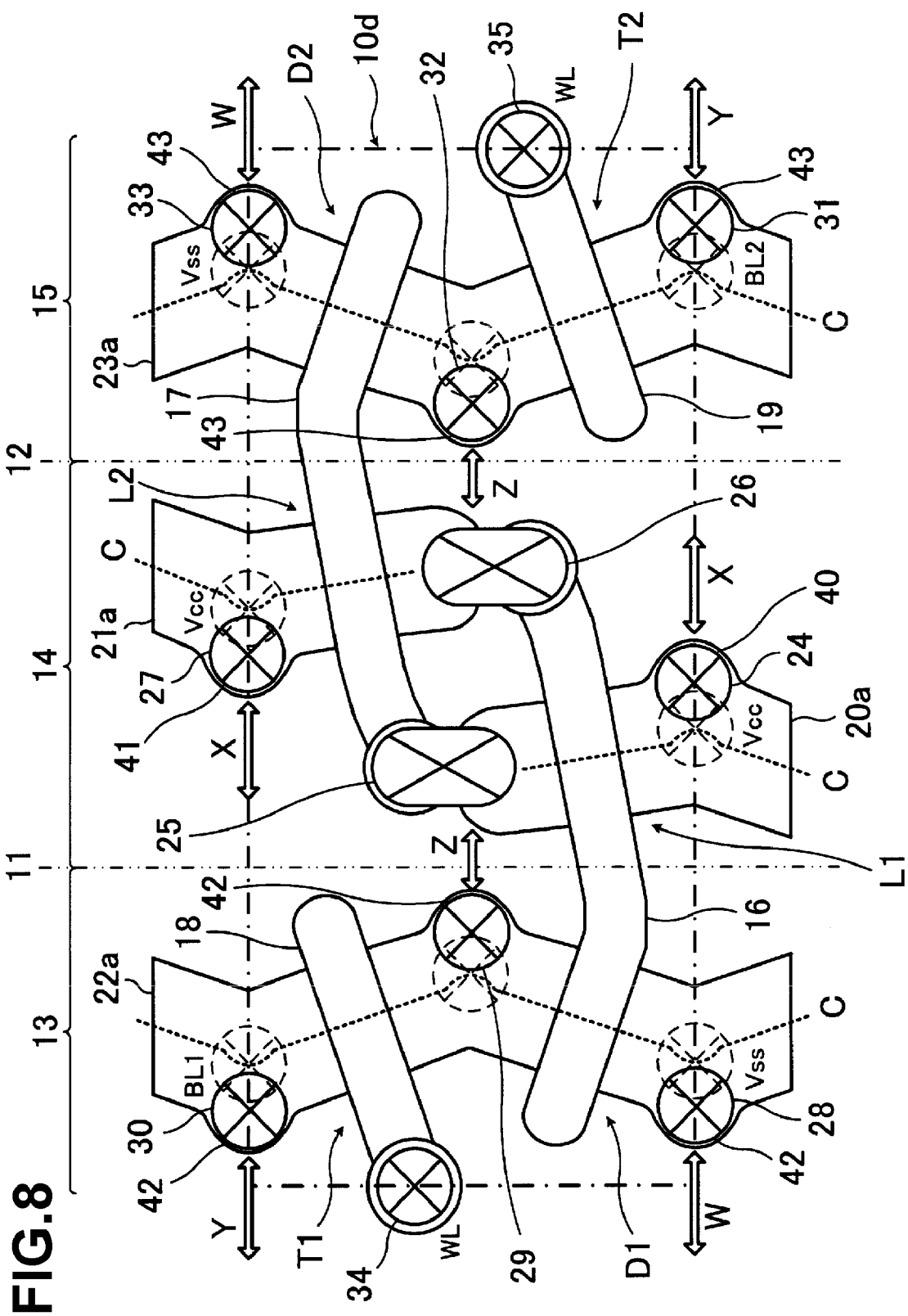
FIG. 8 is a plan view illustrating a unit cell in accordance with a second embodiment.
Figure 9:
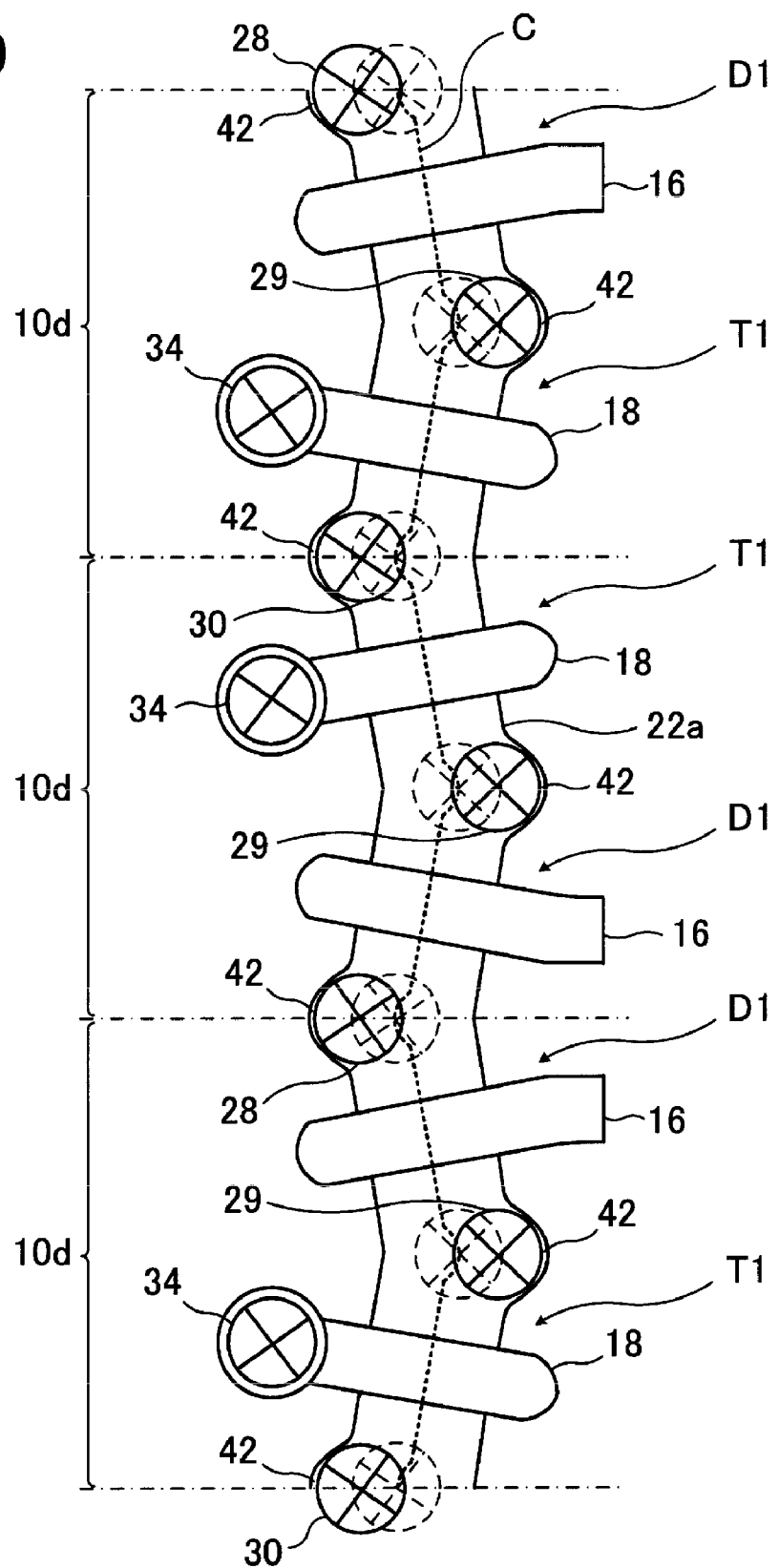
FIG. 9 is a plan view illustrating a major portion of an arrangement of contact electrodes in accordance with the second embodiment.

FIG. 8 is a plan view of a unit cell 10d of the second embodiment, and FIG. 9 is a plan view of a major portion of a contact electrode arrangement in accordance with the second embodiment. In FIGS. 8 and 9, elements identical to those illustrated in FIGS. 4 and 5 are designated with the same reference numerals and the detailed discussion thereof is omitted herein.

The unit cell 10d of FIGS. 8 and 9 includes source and/or drain regions 20a, 21a, 22a, and 23a instead of the source and/or drain regions 20, 21, 22, and 23 in the unit cell 10c of FIGS. 4 and 5. The source and/or drain regions 20a, 21a, 22a, and 23a, generally broad V-bent in plan view, have projections 40, 41, 42, and 43, respectively.

The projection 40 of the source and/or drain region 20a protrudes in a direction along which the distance between the gate electrodes 16 on symmetrical and adjacent unit cells 10d becomes greater. The projection 41 of the source and/or drain region 21a protrudes in a direction along which the distance between the gate electrodes 17 on symmetrical and adjacent unit cells 10d becomes greater. The projections 42 of the source and/or drain region 22a protrude in directions along which the distance between the gate electrodes 16 and 18, and the distance between the gate electrodes 16 and 18 on symmetrical and adjacent unit cells 10d are greater. The projections 43 of the source and/or drain region 23a protrude in a direction along which the distance between the gate electrodes 17 and 19, and the distance between the gate electrodes 17 and 19 on symmetrical and adjacent unit cells 10d are greater.

The load transistors L1 and L2, the driver transistors D1 and D2, and the transfer transistors T1 and T2 are thus constructed based on the source and/or drain regions 20a-23a. The contact electrodes 24-33 are connected to predetermined positions of the respective source and/or drain regions 20a-23a. The contact electrodes 24 and 27-33, from among the contact electrodes 24-33, are off-centered from the respective center lines C of the source and/or drain regions 20a-23a.

Figure 10:
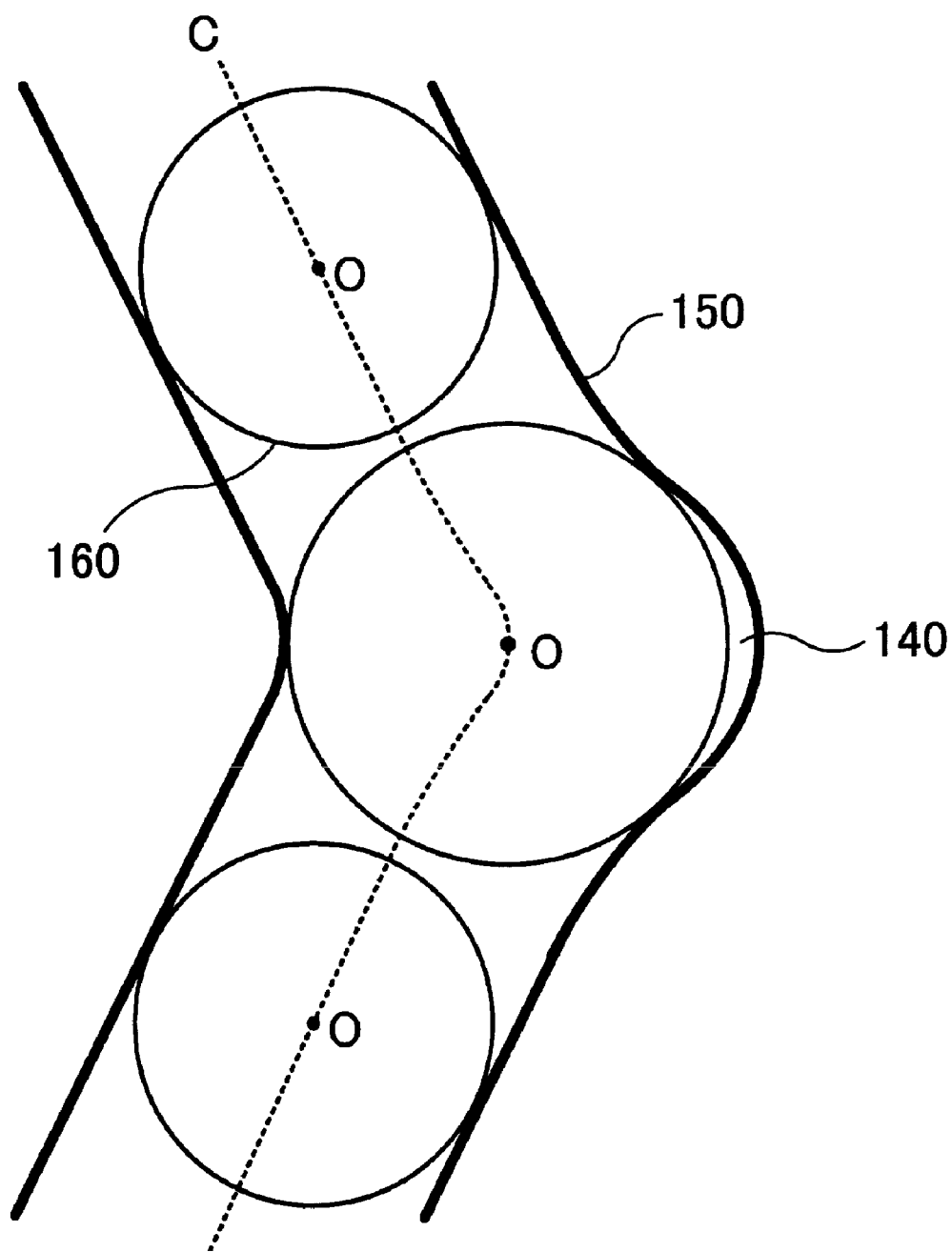
FIG. 10 illustrates a center line of a bent active region having a projection portion in accordance with one embodiment.

FIG. 10 illustrates a center line of a broad-V shaped source and/or drain region having a projection.

As illustrated in FIG. 10, the center line C of the broad-V shaped source and/or drain region 150 having a projection 140 is an envelope line (as denoted by a dotted line) that is drawn by connecting the centers O of circles 160 inscribing the source and/or drain region 150 when the circle 160 is slid continuously along the source and/or drain region 150. (The circle 160 touches at two points, one point at a right edge and the other point at a left edge of the source and/or drain region 150). The center line C of each of the source and/or drain regions 20a-23a within the unit cell 10d is similarly defined.

As illustrated in FIGS. 8 and 9, the contact electrode 29 is shifted with the center thereof moved from the center line C of the source and/or drain region 22a between non-parallel gate electrodes 16 and 18 of the driver transistor D1 and the transfer transistor T1 in a direction along which the distance between the gate electrodes 16 and 18 becomes greater. The contact electrode 29 is disposed on the projection 42 of the source and/or drain region 22a. The distance between the contact electrode 29 and each of the gate electrodes 16 and 18 is set to be larger than when the contact electrode 29 is centered on the center line C of the source and/or drain region 22a (as denoted by chain lines in FIGS. 8 and 9). The transfer transistor T1 and the driver transistor D1 are thus disposed closer to each other accordingly in a substantially vertical direction of FIGS. 8 and 9. The distance between the contact electrode 29 and each of the gate electrodes 16 and 18 is more effectively increased than when the source and/or drain region 22a is not provided with the projection 42.

The other contact electrodes 28 and 30 connected to the source and/or drain region 22a are also similarly disposed. As illustrated in FIGS. 8 and 9, the contact electrode 28 is shifted with the center thereof moved from the center line C of the source and/or drain region 22a between the gate electrodes 16 on unit cells 10d symmetrical and adjacent to each other in a direction along which the distance between the gate electrodes 16 becomes greater. The contact electrode 30 is shifted with the center thereof moved from the center line C of the source and/or drain region 22a between the gate electrodes 18 on unit cells 10d symmetrical and adjacent to each other in a direction along which the distance between the gate electrodes 18 becomes greater.

The same is true of the source and/or drain region 23a. More specifically, with reference to FIG. 8, the contact electrode 32 is shifted with the center thereof moved from the center line C of the source and/or drain region 23a between the gate electrodes 17 and 19 in a direction along which the distance between the gate electrodes 17 and 19 becomes greater. The contact electrode 31 is shifted with the center thereof moved from the center line C of the source and/or drain region 23a between the gate electrode 19 on the unit cell 10d of FIG. 8 and a gate electrode 19 on a unit cell 10d (not shown) symmetrical to and adjacent to the unit cell 10d of FIG. 8 in a direction along which the distance the gate electrodes 19 becomes greater. The contact electrode 33 is shifted with the center thereof moved from the center line C of the source and/or drain region 23a between the gate electrode 17 on the unit cell 10d of FIG. 8 and a gate electrode 17 on a unit cell 10d symmetrical to and adjacent to the unit cell 10d of FIG. 8 in a direction along which the distance between the gate electrodes 17 becomes greater.

The same is true of the source and/or drain regions 20a and 21a. More specifically, the contact electrode 24 is shifted with the center thereof moved from the center line C of the source and/or drain region 20a between the gate electrode 16 of the unit cell 10d of FIG. 8 and a gate electrode 16 on a unit cell 10d (not shown) symmetrical to and adjacent to the unit cell 10d of FIG. 8 in a direction along which the distance between the gate electrodes 16 becomes greater. The contact electrode 27 is shifted with the center thereof moved from the center line C of the source and/or drain region 21a between the gate electrode 17 of the unit cell 10d of FIG. 8 and a gate electrode 17 on a unit cell 10d (not shown) symmetrical to and adjacent to the unit cell 10d of FIG. 8 in a direction along which the distance between the gate electrodes 17 becomes greater.

The contact electrodes 24 and 27-33 are disposed in this way on the source and/or drain regions 20a-23a having the respective projections 40-43. The elements are disposed closer to each other in a generally vertical direction of FIG. 8 with a predetermined distance therebetween still maintained. The size of the unit cell 10d in a generally vertical direction of FIG. 8 is reduced. A position error margin of the elements may be increased during formation of the elements.

The source and/or drain regions 20a-23a are provided with the projections 40-43, respectively, and the contact electrodes 24 and 27-33 are disposed on the projections 40-43. The size of the unit cell 10d in a substantially vertical direction in FIG. 8 is reduced without reducing the position error margin of the source and/or drain regions 20a-23a and the contact electrodes 24 and 27-33.

The same or different degrees of protrusion may be set in the projections 40-43 of the source and/or drain regions 20a-23a. In the setting of protrusion, it is important to take into consideration the geometry of the surrounding elements present in the protrusion direction of the projections 40-43.

In an area labeled the letter W in FIG. 8, the projection 42 becomes closer to a projection 42 on a unit cell 10d symmetrical to and adjacent to the unit cell 10d of interest. The area W is originally a wide margin and the two projections 42 are biased at the same voltage (Vss). The projections 42 may thus be protruded to the degree that the two projections 42 are very close or even touch each other. In an area labeled the letter X in FIG. 8, a sufficient space is originally present in the unit cell 10d. In an area labeled the letter Y in FIG. 8, the projections 43 on the unit cells 10d symmetrical to and adjacent to each other approach each other. Since the projections 43 in the area Y are connected to different bit lines, care needs to be exercised to ensure that the projections 43 are not too close to each other or are free from touching each other. In an area labeled the letter Z in FIG. 8, the projection 42 as an n-type drain region formed on a p-type well 13 becomes close to an n-type well 14. The degree of protrusion of the projections 42 is set taking into consideration a breakdown voltage between the projection 42 and the well 14.

Figure 11:
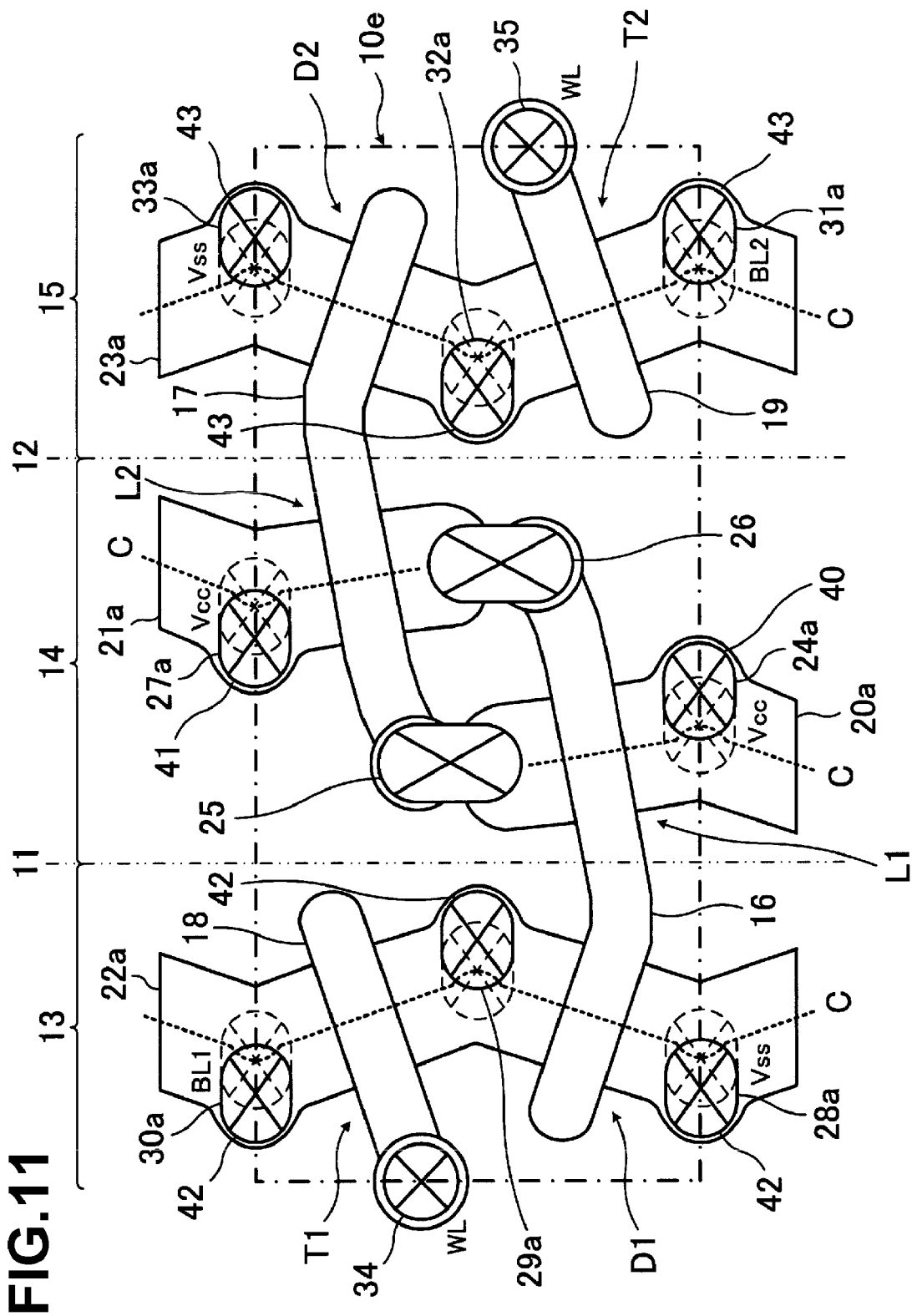
FIG. 11 is a plan view of a unit cell in accordance with a third embodiment.
Figure 12:
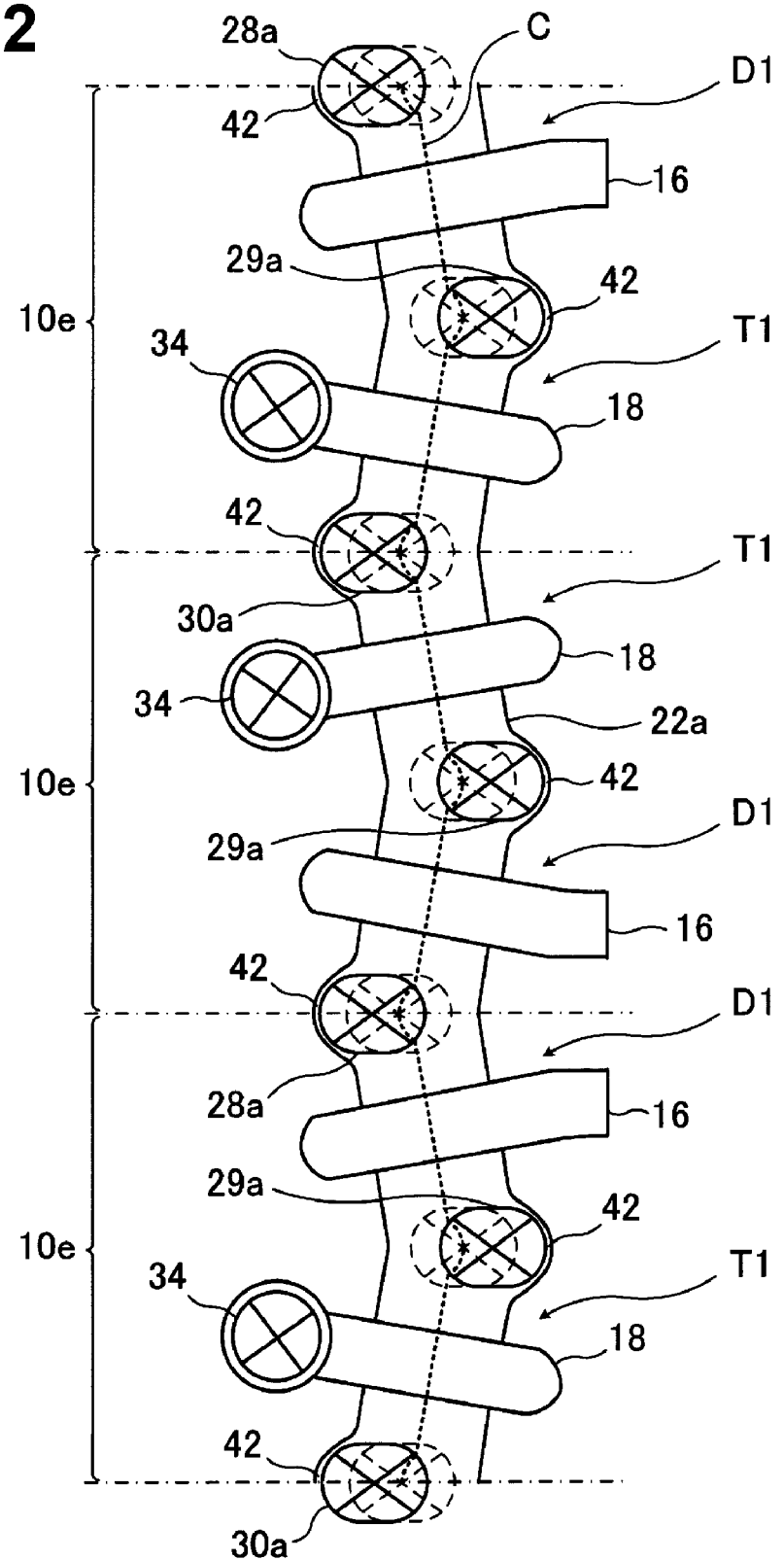
FIG. 12 is a plan view illustrating a major portion of a contact electrode arrangement in accordance with the third embodiment.

FIG. 11 is a plan view of a unit cell 10e in accordance with the third embodiment, and FIG. 12 is a plan view illustrating a major portion of a contact electrode arrangement in accordance with the third embodiment. In FIGS. 11 and 12, elements identical to those illustrated in FIGS. 8 and 9 are designated with the same reference numerals, and the detailed discussion thereof is omitted herein.

The unit cell 10e illustrated in FIGS. 11 and 12 includes generally horizontally elongated contact electrodes 24a and 27a-33a instead of the circular contact electrode 24 and 27-33 illustrated in FIGS. 8 and 9. The contact electrodes 24a and 27a-33a have an elliptic or generally rectangular shape in plan view. FIGS. 11 and 12 illustrate the contact electrodes 24a and 27a-33a, each having a generally rectangular shape. The contact electrodes 24a and 27a-33a are shifted with the center thereof moved from the respectively center lines C of the source and/or drain regions 20a-23a into the direction of protrusion of the projections 40-43 of the source and/or drain regions 20a-23a.

The elongated contact electrodes 24a and 27a-33a so disposed provide the following advantages over the contact electrodes centered on the center line C (as represented by chain lines in FIGS. 11 and 12): The unit cell 10e is reduced in size in a generally vertical direction in FIGS. 11 and 12 with the predetermined distance maintained between the elements, and a position error margin of the elements is increased during formation of the elements.

When the contact electrodes 24a and 27a-33a having the above-described shape are used, slight portions of the contact electrodes 24a and 27a-33a may be disposed out of the areas of the respective source and/or drain regions 20a-23a. Even if a part of each of the contact electrodes 24a and 27a-33a is out of the area, the remaining portion of each of the contact electrodes 24a and 27a-33a is still sufficient to assure contact area with the source and/or drain regions 20a-23a. The use of the contact electrodes 24a and 27a-33a having such a shape increases the position error margin between the source and/or drain regions 20a-23a and the contact electrodes 24a and 27a-33a.

The contact electrodes 24a and 27a-33a having a generally horizontally elongated shape may be used with the source and/or drain regions 20-23 having no projections 40-43. In this case, as well, the shifting of the contact electrodes 24a and 27a-33a with the centers thereof moved from the center lines C of the source and/or drain regions 20-23 still provides advantages of the size reduction of the unit cell, the increased position error margin, and reduced contact resistance.

Figure 13:
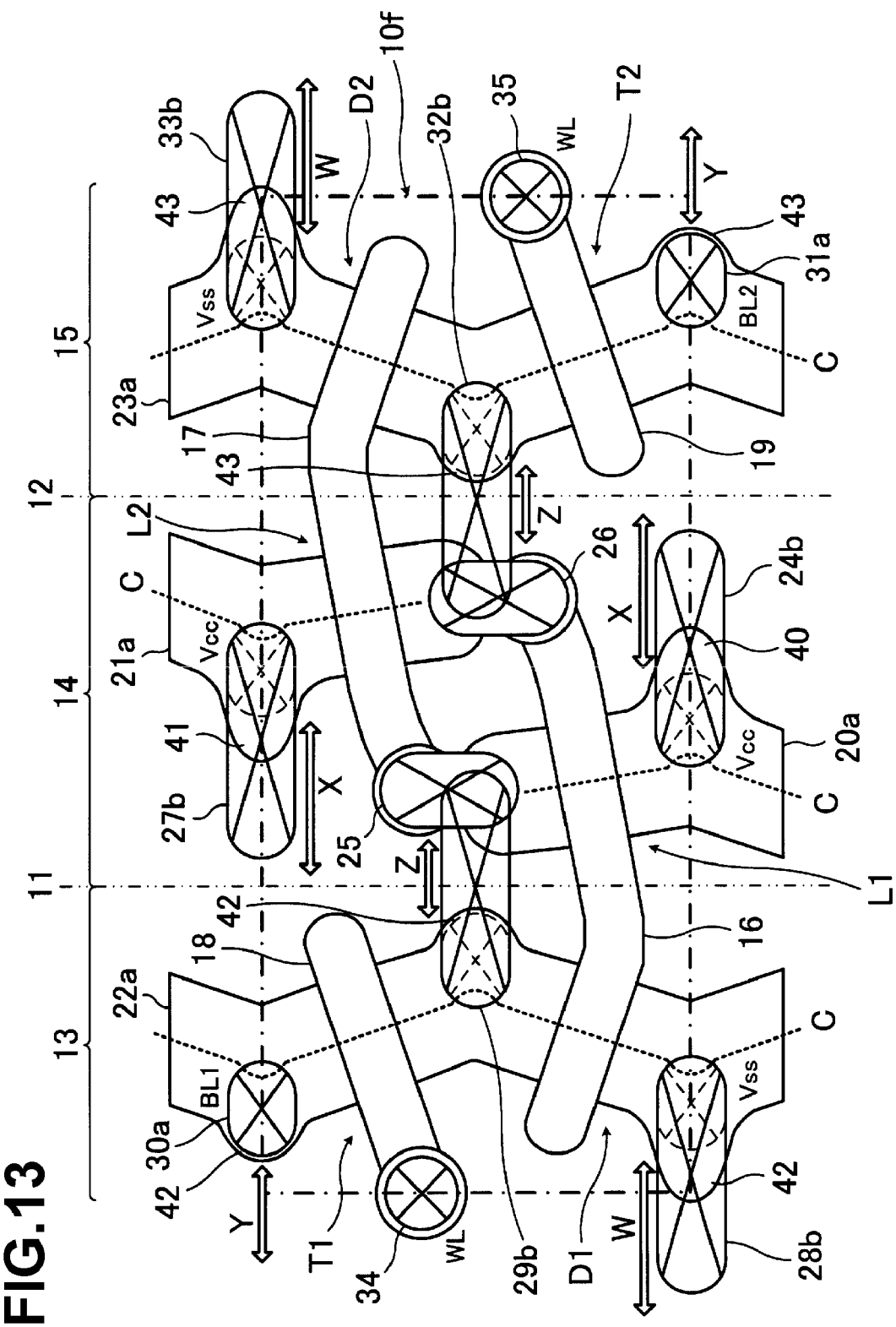
FIG. 13 is a plan view of a unit cell in accordance with a fourth embodiment.

FIG. 13 is a plan view of a unit cell 10f in accordance with the fourth embodiment. With reference to FIG. 13, elements illustrated in FIG. 11 are designated with the same reference numerals and the discussion thereof is omitted herein.

The unit cell 10f of FIG. 13 includes contact electrodes 24b, 27b-29b, 32b and 33b linearly outwardly extending from source and/or drain regions 20a-23a in plan view instead of the contact electrodes 24a, 27a-29a, 32a and 33a of FIG. 11 (as represented by chain lines in FIG. 13). The contact electrodes 24b, 27b-29b, 32b and 33b are made by extending the contact electrodes 24a, 27a-29a, 32a and 33a of FIG. 11 outward from the source and/or drain regions 20a-23a in the direction of protrusion of the projections 40-43 with the end positions of the contact electrodes 24a, 27a-29a, 32a and 33a fixed.

In the unit cell 10f, the projections 40-43 are further protruded in the areas W and X. From the geometry of the unit cell 10f of FIG. 13 with respect to a unit cell 10f symmetrical to and adjacent to the unit cell 10f of FIG. 13, and the geometry of the elements within the unit cell 10f of FIG. 13, the projections 40-43 in the areas W and X are protruded more than in other areas.

The contact electrodes 24b, 27b-29b, 32b and 33b are now considered. The contact electrodes 28b and 33b in the area W extend respectively closer to projections 42 of the same voltage (Vss) on unit cells 10f symmetrical to and adjacent to the unit cells 10f of FIG. 13. It is perfectly acceptable if the contact electrodes 28b and 33b are close to, touch or even make a unitary body with the contact electrodes 28b and 33b of the same shape of the adjacent unit cells 10f, respectively. The contact electrodes 24b and 27b in the area X are disposed taking into consideration the geometry thereof with the transfer transistors T1 and T2, respectively. The contact electrodes 29b and 32b in the area Z may be extended to be close to, touch or even make a unitary body with the contact electrodes 25 and 26 respectively. It is noted that the contact electrodes 25 and 26 connect the load transistors L1 and L2. As previously discussed, the length of protrusion of the projections 42 and 43 of the source and/or drain regions 22a and 23a is limited.

If the contact electrodes 29b and 32b are extended to make a unitary body with the contact electrodes 25 and 26, respectively, no wirings to connect the contact electrodes 29b and 32b to the contact electrodes 25 and 26 respectively are required at the upper layer.

The linearly extending contact electrodes 24b, 27b-29b, 32b and 33b are also applicable to the source and/or drain regions 20-23 having no projections 40-43.

The unit cells 10c-10f having the three types of transistors of the load transistors L1 and L2, the driver transistors D1 and D2, and the transfer transistors T1 and T2 in the slant wiring arrangement have been discussed. If one type, two types, or the three types of transistors are disposed in a slant wiring arrangement, the SRAM unit cell is reduced in size by shifting the contact electrode position.

In the unit cell 10a in the parallel-arrayed SRAM of FIG. 1, only the transfer transistors T1 and T2 may be inclined at a predetermined inclination angle as in the unit cell 10b of FIG. 3. In this case, the contact electrode 29 connected at a bent portion of the source and/or drain region 22 is shifted with the center thereof moved from the center line of the source and/or drain region 22 between the non-parallel gate electrodes 16 and 18 in a direction along which the distance between the gate electrodes 16 and 18 becomes greater. The contact electrode 30 connected at a bent portion of the source and/or drain region 22 is shifted with the center thereof moved from the center line of the source and/or drain region 22 between the gate electrode 18 and an adjacent gate electrode 16 in a direction along which the distance between the gate electrodes 16 and 18 becomes greater. The contact electrode 32 connected at a bent portion of the source and/or drain region 23 is shifted with the center thereof moved from the center line of the source and/or drain region 23 between the non-parallel gate electrodes 17 and 19 in a direction along which the distance between the gate electrodes 17 and 19 becomes greater. The contact electrode 31 connected at a bent portion of the source and/or drain region 23 is shifted with the center thereof moved from the center line of the source and/or drain region 23 between the gate electrode 19 and an adjacent gate electrode 17 in a direction along which the distance between the gate electrodes 19 and 17 becomes greater. The load transistors L1 and L2 are disposed more compactly by resizing the source and/or drain regions 20 and 21 as necessary. The size of the unit cell is generally reduced.

The load transistors L1 and L2 and the driver transistors D1 and D2, disposed on the unit cell 10a as illustrated in FIG. 1, are inclined at a predetermined angle to be the unit cell 10b of FIG. 3. In this case, as well, at least the contact electrodes 24 and 27 connected to bent portions on the source and/or drain regions 20 and 21, and at least the contact electrodes 29, 30, 31, and 32 connected to bent portions on the source and/or drain regions 22 and 23 are shifted in predetermined directions. The entire size of the unit cell is thus generally reduced.

The driver transistors D1 and D2 and the transfer transistors T1 and T2 on the unit cell 10a of FIG. 1 are inclined at a predetermined angle to be the unit cell 10b of FIG. 3. In this case, as well, the contact electrodes 28-33 connected to bent portions on the source and/or drain regions 22 and 23 are shifted in predetermined directions. The entire size of the unit cell is thus generally reduced.

In any of the three embodiments discussed herein, projections may be extended from portions of source and/or drain regions to which the contact electrodes are connected. The contact electrodes shifted in position may have a generally horizontally elongated shape in plan view, the entire or major bottom portion of which falls within the area of the source and/or drain region. The contact electrodes shifted in position may have a generally horizontally elongated shape in plan view, linearly extending beyond the edge of the source and/or drain region as great as the geometry of other elements permits.

Figure 14:
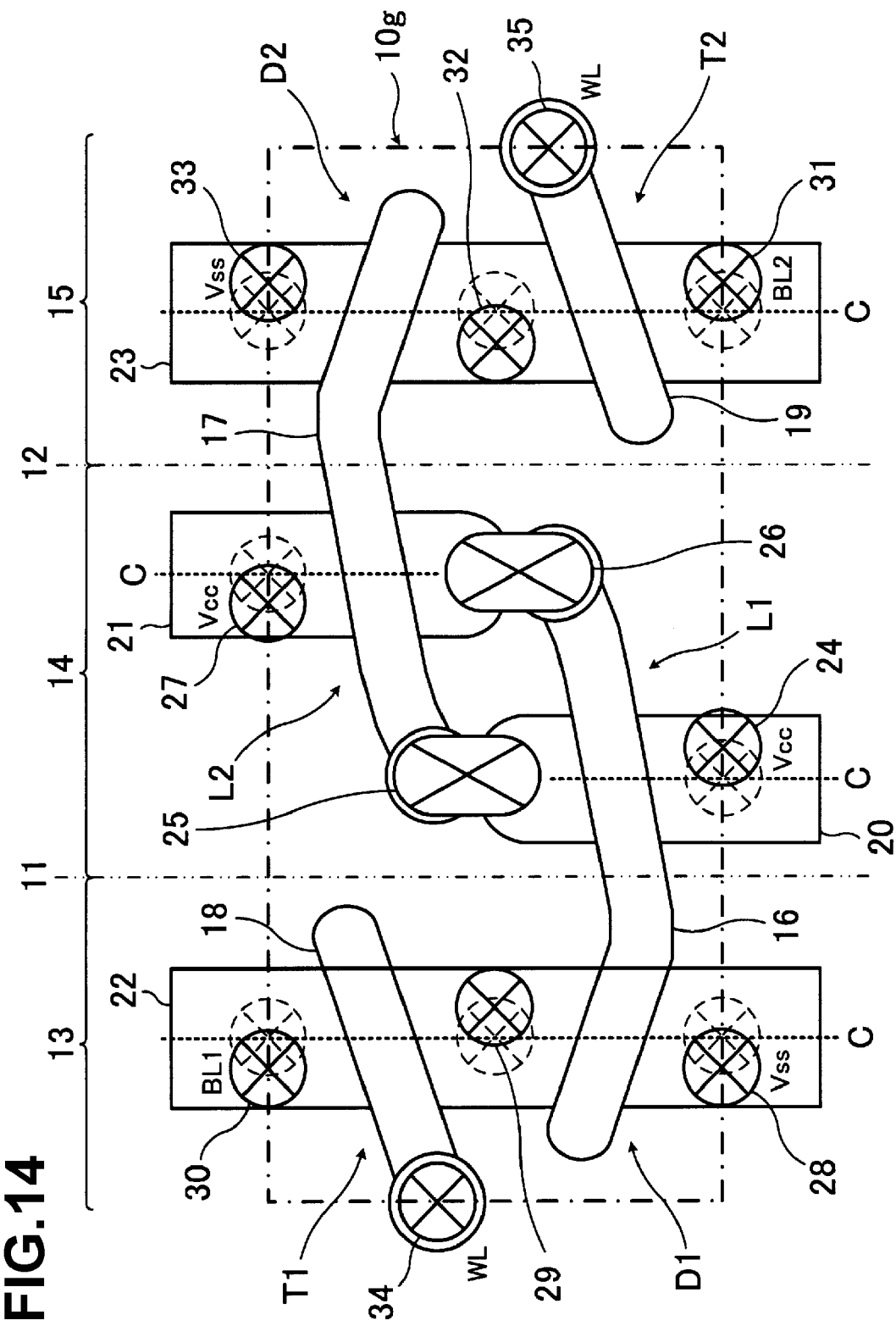
FIG. 14 is a plan view of a unit cell in accordance with a fifth embodiment.
Figure 15:
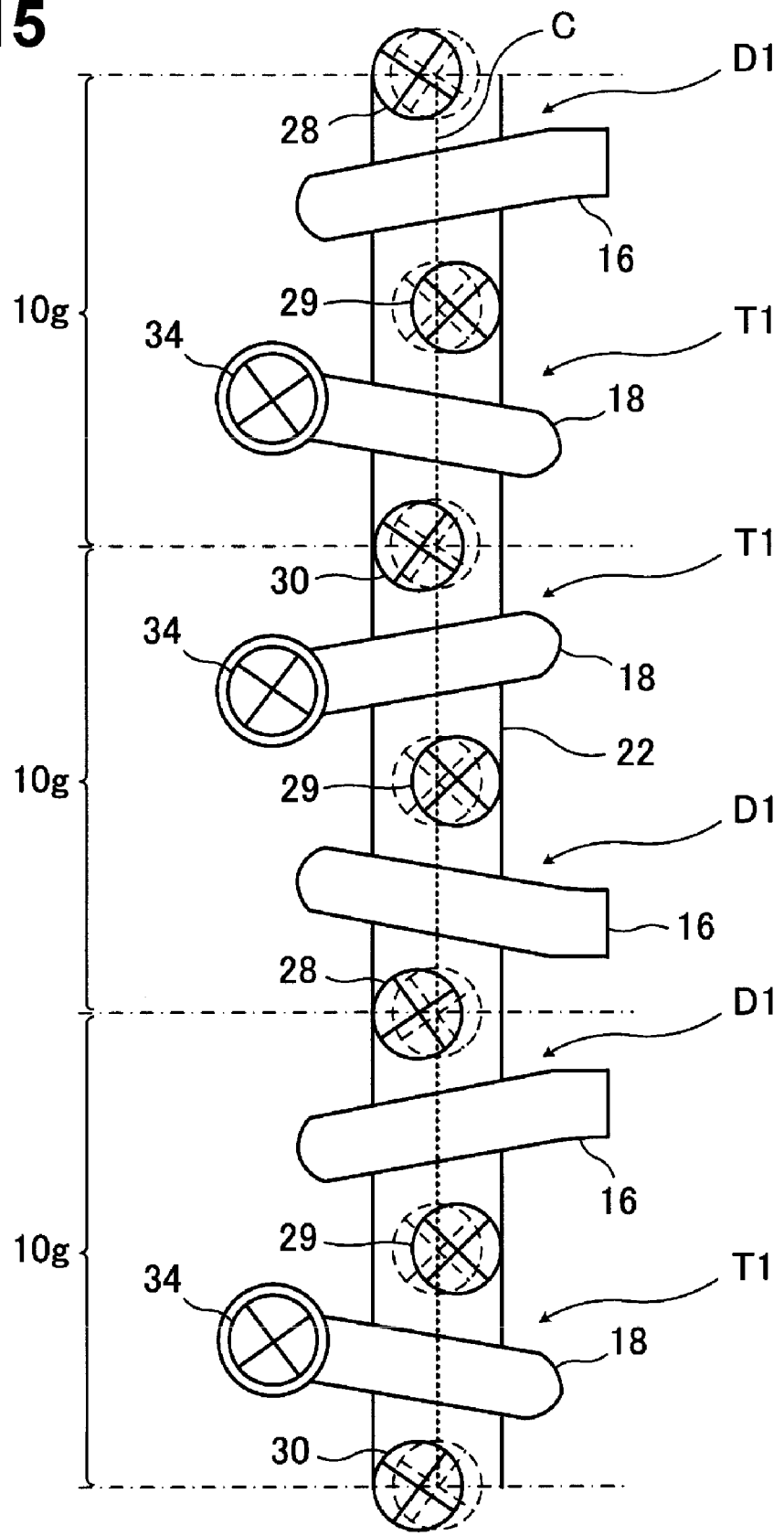
FIG. 15 is a plan view illustrating a major portion of a contact electrode arrangement in accordance with the fifth embodiment.

FIG. 14 is a plan view of a unit cell 10g in accordance with the fifth embodiment, and FIG. 15 is a plan view of a major portion of a contact electrode arrangement in accordance with the fifth embodiment. In FIGS. 14 and 15, elements illustrated in FIG. 1 are designated with the same reference numerals and the detailed discussion thereof is omitted herein.

The unit cell 10g of FIGS. 14 and 15 is made by causing the gate electrodes 16-19 to intersect the linear source and/or drain regions 20-23 at an angle other than right angles in the unit cell 10a in the parallel-arrayed SRAM of FIG. 1. The contact electrodes 24 and 27-33 are shifted from the locations as denoted by chain lines in predetermined directions in FIGS. 14 and 15.

Referring to FIGS. 14 and 15, the contact electrode 29 is shifted with the center thereof moved from the center line C of the source and/or drain region 22 between the gate electrodes 16 and 18 in a direction along which the distance between the gate electrodes 16 and 18 becomes greater. The contact electrode 28 is shifted with the center thereof moved from the center line C of the source and/or drain region 22 between the gate electrodes 16 on unit cells 10g symmetrical to and adjacent to each other in a direction along which the distance between the gate electrodes 16 becomes greater. The contact electrode 30 is shifted with the center thereof moved from the center line C of the source and/or drain region 22 between the gate electrodes 18 on unit cells 10g symmetrical to and adjacent to each other in a direction along which the distance between the gate electrodes 18 becomes greater. The same is true of the contact electrodes 24, 27, and 31-33 in the other source and/or drain regions 20, 21, and 23.

In this way, an increase may occur in the distance between the gate electrode 16 and each of the contact electrodes 24, 28, and 29, the distance between the gate electrode 17 and each of the contact electrodes 27, 32, and 33, the distance between the gate electrode 18 and each of the contact electrodes 29 and 30, and the distance between the gate electrode 19 and each of the contact electrodes 31 and 32. The elements are disposed closer to each other in a generally vertical direction of FIG. 14 with a predetermined distance therebetween still maintained. The size of the unit cell 10g in a generally vertical direction of FIG. 14 is thus reduced. A position error margin of the elements is increased during formation of the elements.

The gate electrodes 16 and 17 may intersect the source and/or drain regions 22 and 23 at an inclination angle in plan view, and may intersect the source and/or drain regions 20 and 21 at right angles in plan view. The source and/or drain regions 20 and 21 of the load transistors L1 and L2 are changed in size in accordance with the size reduction of the driver transistor D1 and transfer transistor T1 and the driver transistor D2 and transfer transistor T2. The elements are thus disposed with the distance therebetween reduced. The unit cell is generally reduced in size.

Figure 16:
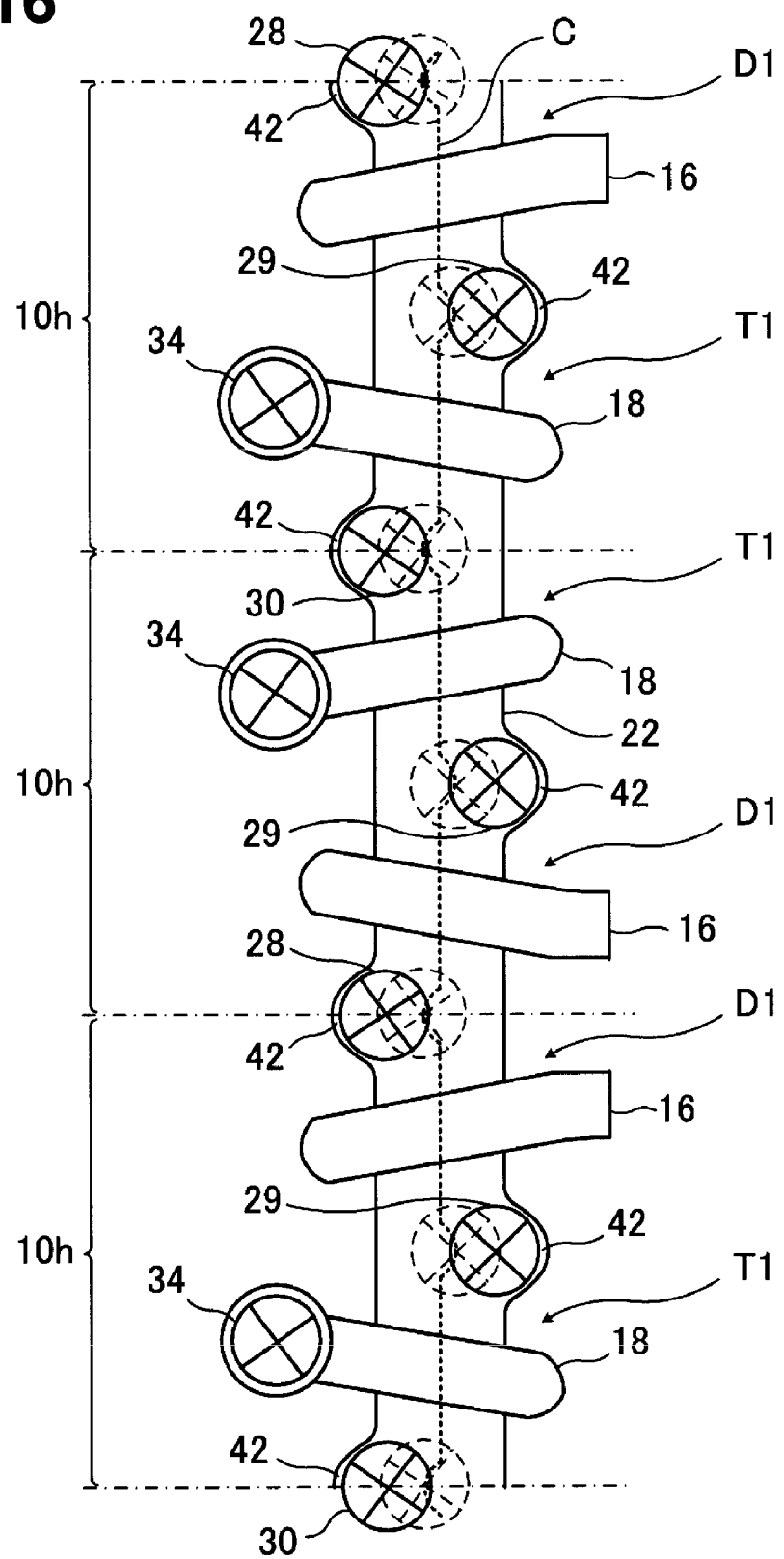
FIG. 16 is a plan view illustrating a major portion of a contact electrode arrangement in accordance with the sixth embodiment.

FIG. 16 is a plan view of a major portion of a contact electrode arrangement in accordance with the sixth embodiment. In FIG. 16, elements identical to those illustrated in FIG. 15 are designated with the same reference numerals and the detailed discussion thereof is omitted herein.

The projections 40-43 may be extended from the source and/or drain regions 20-23 when the gate electrodes 16-19 are inclined in the unit cell 10g of the fifth embodiment.

As illustrated in FIG. 16, the source and/or drain region 22 includes projections 42, one projection 42 between the non-parallel gate electrodes 16 and 18, one projection 42 between the gate electrodes 16 on unit cells 10h symmetrical to and adjacent to each other, and one projection 42 between the gate electrodes 18 on unit cells 10h symmetrical to and adjacent to each other. The contact electrodes 28-30 are disposed at positions shifted in the direction of protrusion of the projections 42 of the source and/or drain region 22. The same is true of the other source and/or drain regions 20, 21, and 23 and the contact electrodes 24, 27, and 30-33 disposed thereon.

The source and/or drain regions 20-23 configured in this way provide a size reduction of the elements and an increase in the position error margin of each element in comparison with the arrangement in which the contact electrodes 24, and 27-33 are centered on the center line C (as presented by chain line in FIG. 16). The size reduction in a generally vertical direction in FIG. 16 is provided without reducing the position error margin of the source and/or drain regions 20-23 and contact electrodes 24 and 27-33.

In the fifth and sixth embodiments, the contact electrodes 24 and 27-33 may have a generally horizontally elongated shape as discussed with reference to the third and fourth embodiments.

The first and second types of transistors out of the load transistors L1 and L2, the driver transistors D1 and D2, and the transfer transistors T1 and T2 may be inclined on the unit cell 10a of FIG. 1. The remaining type of transistors not inclined may be disposed in the same manner as described with reference to the fifth and sixth embodiments. More specifically, in the transistors inclined, the contact electrode on the side of the gate electrode is shifted, and in the transistors not inclined, the gate electrode thereof is inclined and the contact electrodes on both sides of the gate electrode are shifted in a predetermined direction. With this arrangement, the unit cell is generally reduced in size.

As described above, the contact electrode disposed on the source and/or drain region between the pair of non-parallel gate electrodes is disposed with the center thereof moved from the center line of the source and/or drain region in a direction along which the distance between the pair of gate electrodes becomes greater. The unit cell is reduced in size with a predetermined distance maintained between the predetermined elements forming the unit cell. This arrangement contributes to size reduction of the SRAM and an increased memory capacity.

In the above discussion, the SRAM includes a unit cell of six transistors. As great as the SRAM function is assured, the number of transistors forming the unit cell is not limited to six. The above-described arrangement is applicable to an SRAM having a unit cell including transistors of a number different from six. A load element such as a resistor may be used instead of the load transistor.

The above-described arrangement method is applicable to a variety of semiconductor devices including the SRAM. The present technique is not limited to the SRAM. The above-described arrangement method is also applicable to another semiconductor device having two gate electrodes intersecting one source and/or drain region. The present technique also contributes to miniaturizing a host apparatus including such a semiconductor device.

In addition to the above-described embodiments, the following arrangements are also contemplated. The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modification and equivalents may be resorted to, falling within the scope thereof.

What is claimed is:

1. A semiconductor device comprising:
   a pair of gate electrodes extending adjacent to and non-parallel to each other;
   a source and/or drain region located between the pair of gate electrodes for forming a pair of transistors with the gate electrodes; and
   a contact electrode disposed between the pair of gate electrodes in contact with the source and/or drain region in a contact area so that a center of the contact area is shifted from the center of the source and/or drain region in a direction along which a distance between the pair of gate electrodes becomes greater.

2. The semiconductor device according to claim 1, wherein the center of the contact area is disposed to be equidistant to the pair of gate electrodes.

3. The semiconductor device according to claim 1, wherein the source and/or drain region has a bent portion between the pair of gate electrodes.

4. The semiconductor device according to claim 3, wherein the source and/or drain region has a convex form protruding in the direction along which the distance between the pair of gate electrodes becomes greater.

5. The semiconductor device according to claim 1, wherein the source and/or drain region has a projection protruding between the pair of gate electrodes in the direction along which the distance between the pair of gate electrodes becomes greater.

6. The semiconductor device according to claim 1, wherein a part of the contact area of the contact electrode is disposed on the source and/or drain region.

7. The semiconductor device according to claim 1, wherein the contact electrode elongates extending in the direction along which the distance between the pair of gate electrodes becomes greater.

8. The semiconductor device according to claim 7, wherein the contact electrode crosses the source and/or drain region in plan view.

9. A semiconductor device comprising:
   an SRAM unit cell having a driver transistor;
   a transfer transistor; and
   a load element;
   wherein a pair of gate electrodes extends adjacent to and non-parallel to each other, the pair of gate electrodes including the gate electrode of one of the driver transistor and the transfer transistor, wherein a source and/or drain region locates between the pair of gate electrodes for forming the driver transistor and the transfer transistor with the gate electrodes, the source and/or drain region being commonly shared by the transistors, and wherein a contact electrode is disposed between the pair of gate electrodes in contact with the source and/or drain region in a contact area so that a center of the contact area is shifted from the center of the source and/or drain region in a direction along which a distance between the pair of gate electrodes becomes greater.

10. The semiconductor device according to claim 9, wherein the gate electrode is used as a gate electrode of the driver transistor and a gate electrode of the transfer transistor.

11. The semiconductor device according to claim 9, wherein the gate electrode is used as a gate electrode of one of the driver transistor and a gate electrode of the driver transistor of adjacent cells.

12. The semiconductor device according to claim 9, wherein the gate electrode is used as a gate electrode of one of the transfer transistor and a gate electrode of the transfer transistor of adjacent cells.

13. The semiconductor device according to claim 9, wherein the load element includes a load transistor.

14. A semiconductor device comprising:

an SRAM unit cell having a driver transistor;

a transfer transistor; and a load transistor;

wherein a pair of gate electrodes extends adjacent to and non-parallel to each other, the pair of gate electrodes including gate electrodes of the load transistors on adjacent unit cells, wherein a source and/or drain region is located between the pair of gate electrodes for forming the driver transistor and the transfer transistor with the gate electrodes, the source and/or drain region being commonly shared by the load transistors of adjacent unit cells, and wherein a contact electrode is disposed between the pair of gate electrodes in contact with the source and/or drain region in a contract area so that a center of the contact area is shifted from the center of the source and/or drain region in a direction along which a distance between the pair of gate electrodes becomes greater.

* * * * *